(12) United States Patent
Arz et al.

(10) Patent No.: US 6,636,041 B2
(45) Date of Patent: Oct. 21, 2003

(54) MAGNETIC RESONANCE APPARATUS HAVING AN OPTICAL FIBER WITH A BRAGG GRATING FOR MEASURING MECHANICAL DEFORMATIONS

(75) Inventors: Winfried Arz, Erlangen (DE); Matthias Drobnitzky, Spardorf (DE)

(73) Assignee: Siemens Aktiengesellschaft, Münich (DE)

( * ) Notice: Subject to any disclaimer, the term of this patent is extended or adjusted under 35 U.S.C. 154(b) by 18 days.

(21) Appl. No.: 09/902,509

(22) Filed: Jul. 10, 2001

(65) Prior Publication Data
US 2002/0008518 A1 Jan. 24, 2002

(30) Foreign Application Priority Data

Jul. 18, 2000 (DE) .......................... 100 34 924
Dec. 28, 2000 (DE) .......................... 100 65 958

(51) Int. Cl.⁷ ................................ G01V 3/00
(52) U.S. Cl. .................. 324/322; 324/318; 324/300
(58) Field of Search ............... 324/322, 318, 324/300; 85/37, 12; 250/227

(56) References Cited

U.S. PATENT DOCUMENTS 5,022,272 A * 6/1991 Bronowicki et al. .......... 73/772
5,760,391 A * 6/1998 Narendran ............. 250/227.14
6,278,810 B1 * 8/2001 Sirkis et al. .................. 385/12
6,304,696 B1 * 10/2001 Patterson et al. ............. 385/27
6,353,319 B1   3/2002 Dietz et al.
6,470,205 B2 * 10/2002 Bosselmann ................ 600/424

FOREIGN PATENT DOCUMENTS

DE    OS 198 27 258    12/1999
DE    OS 198 29 296    1/2000

OTHER PUBLICATIONS

"Faser–Bragg–Gitter: frequenzselektive Faserelemente mit maßgeschneiderten Eigenschaften," Hagemann et al., Physikalische Blätter, vol. 54, No. 3 (1998) pp. 243–245.

"Arbeitsblätter Lichtwellenleiter–Technik," Bragg–Gitter, Eberlein, Funkschau Ausgabe, vol. 3, (1999) pp. 59–60.

* cited by examiner

Primary Examiner—Diego Gutierrez
Assistant Examiner—Brij B. Shrivastav
(74) Attorney, Agent, or Firm—Schiff Hardin & Waite

(57) ABSTRACT

A magnetic resonance apparatus has at least one section of an optical fiber with at least one Bragg grating having a Bragg wavelength. The Bragg grating is arranged with respect to the magnetic resonance apparatus so that at least one deformation of the magnetic resonance apparatus can be acquired.

74 Claims, 2 Drawing Sheets

MAGNETIC RESONANCE APPARATUS HAVING AN OPTICAL FIBER WITH A BRAGG GRATING FOR MEASURING MECHANICAL DEFORMATIONS

BACKGROUND OF THE INVENTION

1. Field of the Invention

The present invention is directed to a magnetic resonance apparatus.

2. Description of the Prior Art

Magnetic resonance technology is a known technology for acquiring images of an inside of a body of an examination subject. To that end, rapidly switched gradient fields that are generated by a gradient coil system are superimposed in a magnetic resonance apparatus on a static basic magnetic field that is generated by a basic field magnet system. The magnetic resonance apparatus further has a radiofrequency system that emits radiofrequency signals into the examination subject for triggering magnetic resonance signals and that picks up the generated magnetic resonance signals. Magnetic resonance images are produced based on the received signals.

For generating gradient fields, suitable currents must be produced in gradient coils of the gradient coil system. The amplitudes of the required currents amount to up to several 100 A. The current rise and fall rates amount to up to several 100 kA/s. Given a basic magnetic field on the order of magnitude of 1 T, Lorentz forces that lead to mechanical oscillations of the gradient coil system occur as a result of these time-variable currents in the gradient coils. These oscillations are transmitted to the surface of the apparatus via various propagation paths, where these mechanical oscillations are converted into acoustic oscillations, which ultimately lead to inherently unwanted noise.

An analysis of these oscillations can be made, for example, by analyzing the natural oscillations of the gradient coil system. The natural oscillatory behavior is defined by the natural frequencies and the natural oscillation modes. The effect of the Lorentz forces on the natural oscillation modes is described in the form of participation factors. These indicate the strength with which the Lorentz forces excite a specific natural oscillation form Given knowledge of the participation factors and of the natural frequencies, the oscillation of the gradient coil system for every location and for every frequency can be determined by a superimposition of the oscillations of the individual natural oscillation modes.

Conversely, however, oscillations and/or impacts deriving from the environment in which the magnetic resonance apparatus is placed also can be transmitted onto the apparatus. When, for example, the apparatus is placed in load-bearing fashion on a floor of a room, then deformations of the floor that are generated outside the apparatus are transmitted onto the apparatus, which can lead to a degradation of the quality of magnetic resonance images.

Measurements representing the above-described oscillations are obtained, for example, during a testing mode of the magnetic resonance apparatus in the lab. To this end, a number of wire strain gauges, piezo-sensors and/or acceleration sensors with which the oscillations or deformations can be measured are attached to the apparatus. Such wire strain gauges, for example, are not suited for a long-term investigation of the oscillatory behavior outside the lab due to a lack of electromagnetic compatibility with image registration modes of the apparatus. Such long-term investigations, however, are desirable in order to derive design changes of the apparatus and/or modifications in the drive of the apparatus from an exact knowledge of the oscillations, with the objective of a noise-reduction.

German OS 44 32 747 A1 and OS 198 29 296 disclose actuators allocated to the gradient coil system, particularly actuators containing piezoelectric elements whose deformation can be controlled such that deformations of the gradient coil system arising during operation of the magnetic resonance apparatus can be actively opposed. The piezoelectric elements are suitably controlled by an electrical voltage applied to them.

The article, "Faser-Bragg-Gitter: Frequenzselecktive Faserelemente mit maβgeschneiderten Eigenschaften" by V. Hagemann et al., in Physikalische Blätter 54, No. 3, 1998, pages 243–245, discloses a fiber Bragg grating. Essentially, this is an optical grating integrated into an optical fiber. Light waves that are conducted in the optical fiber and reach the Bragg grating and that satisfy the Bragg condition are reflected by the Bragg grating in a characteristic way. For meeting the Bragg condition, a grid spacing of the Bragg grating, the wavelength of the light, and an incident angle of the light must be in a specific relationship relative to one another. The Bragg condition is usually only met for one specific wavelength, referred to as the Bragg wavelength. The Bragg grating, thus, is wavelength-selective. Light having a different wavelength can pass the Bragg grating unimpeded. Further details are described in the article by D. Eberlein, "Arbeitsblätter Lichtwellenleiter-Technik: Bragg-Gitter", Funkschau, Edition 13/99, pages 59 and 60.

The above articles point out the possibility of utilizing the fiber Bragg grating in a measuring instrument as a sensor for acquiring temperature changes and/or changes in length. The suitability of a fiber Bragg grating for this purpose particularly derives from the dependency of the Bragg wavelength on the temperature and/or on a mechanical stretching or compression of the Bragg grating, which leads to a modification of the grid spacings of the Bragg grating, and thus to a characteristic change of the wavelength of the light reflected by the Bragg grating.

Further, German OS 198 27 258 discloses a fiber-optic data transmission system containing fiber Bragg gratings. In a preferred embodiment, a number of fiber Bragg gratings are arranged in an optical fiber distributed over the length thereof, and the optical fiber is merely connected to an evaluation device. The fiber Bragg gratings are implemented with different Bragg wavelengths for an overlap of the light components reflected by the individual fiber Bragg gratings.

SUMMARY OF THE INVENTION

An object of the present invention is to provide an improved magnetic resonance apparatus with which, among other things, a deformation behavior arising during operation of the magnetic resonance apparatus can be measured.

This object is inventively achieved in a magnetic resonance apparatus having at least one section of an optical fiber, with at least one Bragg grating with a Bragg wavelength, arranged with respect to the magnetic resonance apparatus so that at least one deformation of the magnetic resonance apparatus can be measured.

Because the optical fiber with the Bragg grating can be fashioned as a purely optical system with magnetically neutral properties, a measurement of deformations of the magnetic resonance apparatus, for example as a consequence of oscillations, is possible during a normal image acquisition mode of the apparatus without disturbing the image acquisition mode due to electromagnetic incompatibilities. Long-term investigations thus can be implemented, and design changes of the apparatus and/or changes in the drive of the apparatus with the goal of a noise-reduction can be derived therefrom as a result of an exact knowledge of the oscillations. Further, the optical fiber can be easily integrated into the magnetic resonance apparatus due to its extremely low space requirement, and an acquisition of deformations at optimally many locations of the magnetic resonance apparatus can be realized. Moreover, since Bragg gratings have long-term constancy without frequent calibration, the optical fiber with the Bragg grating is suited for a long-term utilization in an especially advantageous way. Further, Bragg gratings are distinguished by their high linearity when measuring deformations and by their frequency stability.

In an embodiment, the optical fiber is allocated to a control circuit as a sensor for the deformation, at least one actuator, particularly a piezoelectric element, being controllable with this control circuit for opposing (counteracting) the deformation. As a result, the deformations of the magnetic resonance apparatus can not only be measured but also can be compensated by a corresponding control of the stretching or compression of the actuator. Creation of deformations of the magnetic resonance apparatus and/or forwarding (transmission) of deformations thus can be prevented. Due to the fashioning of the optical fibers as a purely optical system, a high electromagnetic compatibility is also established with respect to the actuators.

DESCRIPTION OF THE PREFERRED EMBODIMENTS

Figure 1:
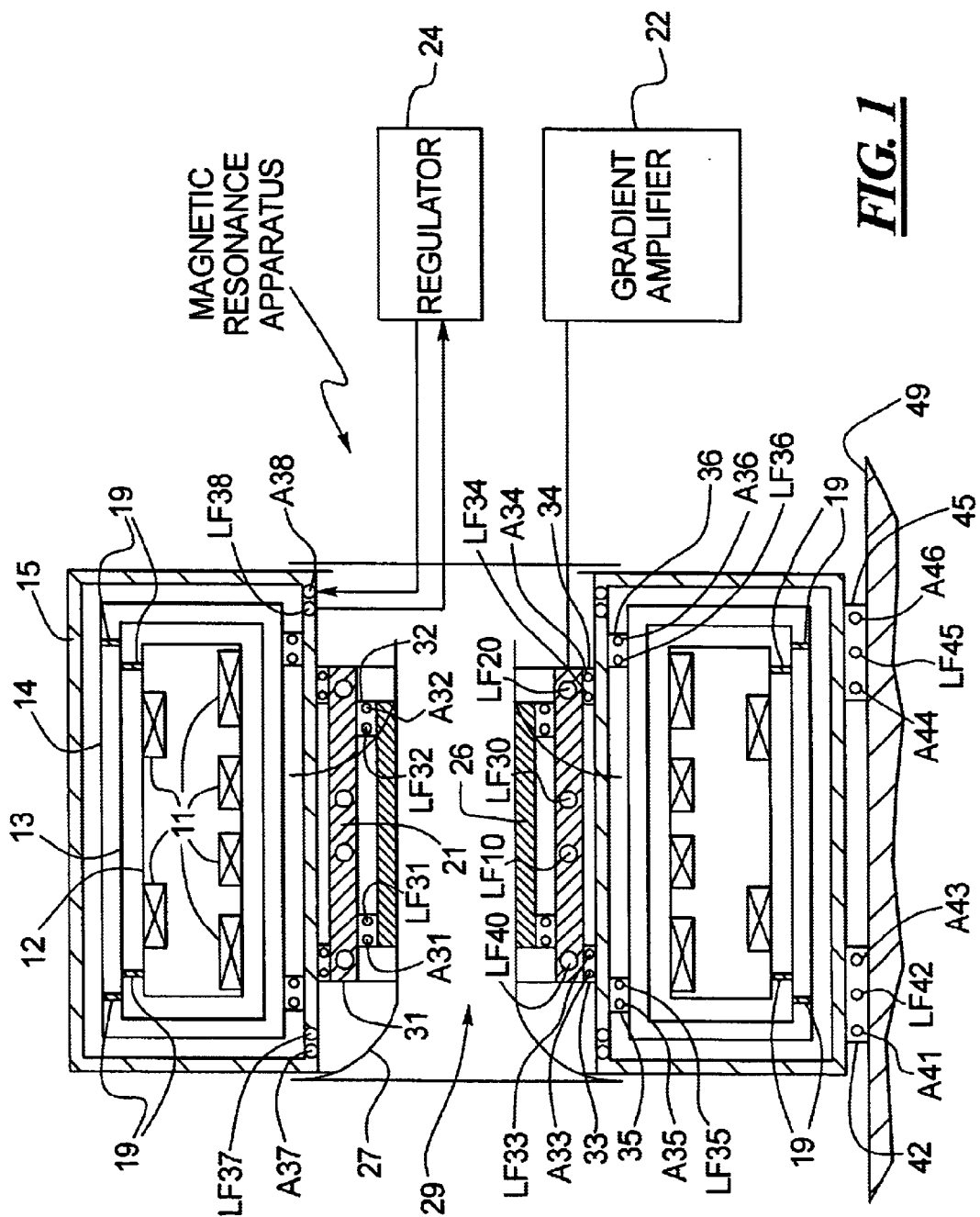
FIG. 1 is a longitudinal section through a magnetic resonance apparatus containing actuators and optical fibers with Bragg gratings in accordance with the invention.

As an exemplary embodiment of the invention, FIG. 1 shows a longitudinal section through a magnetic resonance apparatus containing actuators A31 through A46 and optical fibers LF10 through LF 45 with Bragg gratings. For generating a basic magnetic field that is homogeneous at least within an examination volume 29, the magnetic resonance apparatus has a superconducting basic field magnet system. This contains a hollow-cylindrical helium container 12 in which superconducting coils 11 that a cooled by the liquid helium surrounding them are arranged. The helium container 12 is surrounded by an inner cryoshield 13, allowing optimally little heat radiation to penetrate to the helium container 12. The helium container 12 is connected to the inner cryoshield 13 via thin fiberglass rods 19 having poor thermal conductivity. The inner cryoshield 13 is in turn surrounded by an outer cryoshield 14 that is likewise intended to prevent a penetration of heat radiation to the helium container 12. The two cryoshields 13 and 14 are in turn connected to one another via fiberglass rods 19 having poor thermal conductivity. Finally, the outer cryoshield 14 is surrounded by a vacuum vessel 15. A suspension of the outer cryoshield 14 in the vacuum vessel 15 in turn ensues via connector devices 35 and 36 having poor thermal conductivity.

A gradient coil system 21 as well as an antenna system 26 are arranged in the cylindrical opening of the hollow-cylindrical vacuum vessel 15. The systems 21 and 26 are mechanically connected to one another via appropriate connector devices 31 through 34. The gradient coil system 21 is connected to a gradient amplifier 22 for the control and supply of gradient coils of the gradient coil system 21 with corresponding currents. A funnel-shaped covering 27 that represents a spatial limitation of the examination volume 29 in the magnetic resonance apparatus is attached to the antenna system 26. In the region of the examination volume 29, the funnel-shaped covering 27, and the surface of the vacuum vessel 15, form an outer sheath of the magnetic resonance apparatus. The vacuum vessel 15 is connected via corresponding connector devices 42 and 45 to the floor 49 of a placement room.

For acquiring deformations of the gradient coil system 21, optical fibers LF10, LF20, LF30 and LF40 with Bragg gratings BG11 through BG52 are integrated into the gradient coil system 21. Further details with respect thereto are described in FIG. 2.

Further, the connector devices 31 through 36 that are arranged between the antenna system 26 and the gradient coil system 21, the gradient coil system 21 and the vacuum vessel 15 as well as the vacuum vessel 15 and the outer cryoshield 14 have actuators A31 through A36 and optical fibers LF31 through LF36 with Bragg gratings. The Bragg gratings thereby provide a measurement representing the deformations proceeding from the gradient coil system 21 during operation of the magnetic resonance apparatus and control a stretching or compression of the actuators A31 through A36, for example in an embodiment as piezoelectric elements, such that the deformations remain limited to the gradient coil system 21 insofar as possible. The same is true of the optical fibers LF37 and LF38 with Bragg gratings and the appertaining actuators A37 and A38 that are integrated into the vacuum sheath 15.

The connector devices 42 and 45 between the vacuum vessel 15 and the floor 49 of the placement room, these connector devices 42 and 45 being provided with actuators A41 through A46 and with optical fibers LF42 and LF45, prevent a transmission of deformations of the magnetic resonance apparatus onto the floor 49 as well as, conversely, from the floor 49 onto the magnetic resonance apparatus.

With reference to the example of the actuator A38 and the optical fiber LF38 integrated into the vacuum vessel 15, their interaction for preventing a transmission of deformation shall be explained below. Deformations of the vacuum vessel 15 proceeding from the gradient coil system 21 can be detected with the optical fiber LF38 integrated into the vacuum vessel 15 as well as with an operating device connected to the optical fiber LF38, being detectable at the installation point of the optical fiber LF38. Further details about the operating device are described in FIG. 2. The acquired deformation is supplied to a regulator 24 as actual value. Since the deformations of the gradient coil system 21 are determined among other things, by the time curve of the currents in the gradient coils, a quantity that controls the currents is likewise supplied to the regulator 24 as reference value. To that end, the regulator 24 is connected to the gradient amplifier 22. As a result of the acquired deformation as well as taking the quantity that controls the currents into consideration, the regulator 24 controls a deformation of the actuator A38 such that the deformations of the vacuum vessel 15 proceeding from the gradient coil system 21 are compensated and, thus, cannot be transmitted beyond the installation point of the optical fiber LF38 or of the actuator A38. To that end, the regulator 24 is correspondingly connected to the actuator A38.

Figure 2:
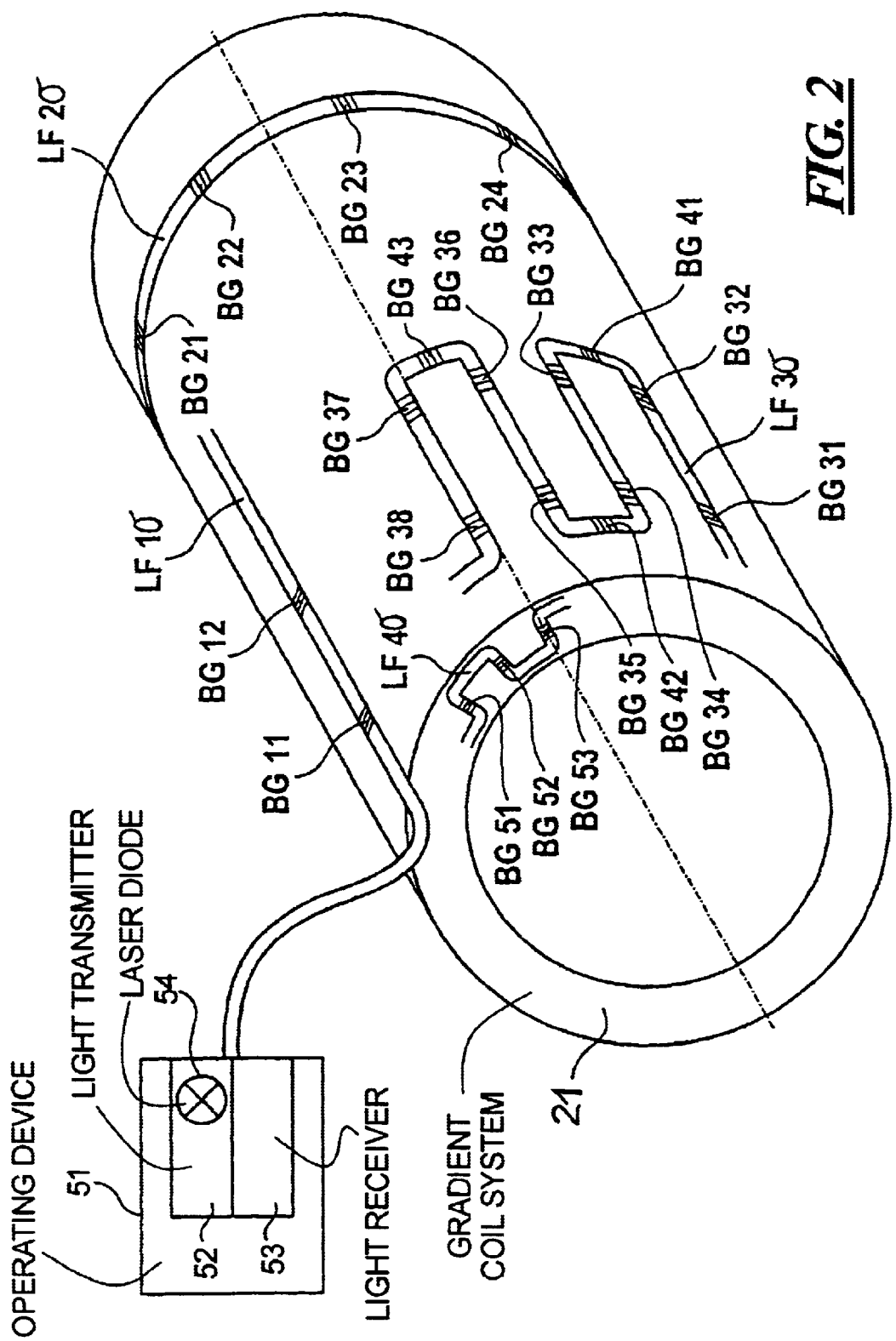
FIG. 2 shows a cast hollow-cylindrical coil system containing optical fibers with Bragg gratings in accordance with the invention.

As an exemplary embodiment of the invention, FIG. 2 shows the cast, hollow-cylindrical gradient coil system 21 of the magnetic resonance apparatus. The gradient coil system 21 has sections of optical fibers LF10, LF20, LF 30 and LF40 as well as gradient coils, shielding coils, cooling devices and a shim assembly these known latter components are not shown for clarity. The sections of the optical fibers LF10, LF20, LF30 and LF40 proceeding in the gradient coil system 21 are arranged mechanically fixed in the gradient coil system 21, as a result of being therewith upon manufacture of the gradient coil system 21, so that the oscillations of the gradient coil system 21 arising during operation of the magnetic resonance apparatus are directly transmitted onto the sections. A co-casting of the sections is unproblematical because a co-casting of optical fibers similar to the optical fibers LF10, LF20, LF30 and LF40 is adequately known and tested for fixing windings of the gradient and/or shielding coils. Each of the optical fibers LF10, LF20, LF30 and LF40 contains a number of Bragg gratings BG11 through BG53 in the sections that are arranged within the gradient coil system, whereby the respective Bragg gratings BG11 through BG53 of the optical fibers LF10, LF20, LF30 or LF40 exhibit Bragg wavelengths that are different from one another.

The functioning of the optical fibers LF10, LF20, LF30 and LF40 is described in greater detail with reference to the example of the optical fiber LF10 with the two Bragg gratings BG11 and BG12. The optical fiber LF10 is light-conductively connected to an operating device 51 arranged outside the gradient coil system 21. The operating device 51 contains a light transmitter 52 with a laser diode 54 that generates light having a prescribable spectral bandwidth and emits it into the optical fiber LF10, and also contains a light receiver 53 that picks up light reflected by the Bragg gratings BG11 and BG12 and analyzes it wavelength-selectively. The reflected light thereby has spectral components that essentially correspond to the respective Bragg wavelengths of the Bragg gratings BG11 and BG12, these Bragg wavelengths in turn having a dependency on the deformation of the Bragg gratings BG11 and BG12. The Bragg wavelengths of the Bragg gratings BG11 and BG12 vary as a consequence of the deformation of the gradient coil system 21 at the location of the Bragg gratings BG11 and BG12, particularly given a directional component of the deformation in the direction of the propagation direction of the light at the location of the Bragg gratings BG11 or BG12. The propagation direction of the light at the location of the Bragg gratings BG11 and BG12 coincides with the laying direction of the optical fiber LF10 and the location of the Bragg gratings BG11 and BG12, which proceeds parallel to a principal cylinder axis of the gradient coil system 21. Since mechanical deformations of the gradient coil system 21 are only acquired at the location of the Bragg gratings BG11 and BG12, the path of sections of the optical fiber LF10 that contain no Bragg gratings is irrelevant in view of the deformation acquisition.

Since, in particular, deformations in the direction of the propagation direction of the light are acquired, the Bragg gratings BG11 through BG53, or the optical fibers LF10, LF20, LF30 and LF40, are arranged such that deformations in a longitudinal direction parallel to the principal hollow cylinder axis as well as deformations in a circumferential direction as well as deformations in a radial direction of the gradient coil system 21 can be acquired. An optical fiber arrangement corresponding to the optical fiber LF20 is suited for the acquisition of deformations in the circumferential direction, and an arrangement corresponding to the optical fiber LF40 is suited for the radial direction. Deformations in the circumferential direction as well as in the longitudinal direction can be acquired with an arrangement corresponding to the optical fiber LF30. Deformations in the longitudinal direction are acquired with the Bragg gratings BG31 and BG38. As set forth above, the exact course of the optical fiber LF30 between the Bragg gratings BG31 through BG43 is irrelevant for the deformation acquisition. Moreover, an arrangement also can be implemented with which all three directions or other combinations of directions can be acquired with one optical fiber.

For optimal surface-coverage and comprehensive deformation acquisition of the gradient coil system 21, the optical fibers LF10, LF20 and LF30, in particular, are arranged surface-proximate at an inside as well as at an outside hollow cylinder surface in one embodiment and exhibit a corresponding density of Bragg gratings BG11 through BG38. A correspondingly high-resolution acquisition of deformations of the gradient coil system 21 is thus possible. In a supplementary embodiment, at least one temperature sensor is arranged within the gradient coil system 21 for acquiring an operating temperature of the gradient coil system 21, particularly of the optical fibers LF10, LF20, LF30 and LF40, and is connected to the operating device 51 for the communication of acquired operating temperatures. As a result, the operating device 51 is able to separate deformations produced due to variations of the operating temperature, for example as a result of a flow of current within the gradient and/or shielding coils, from deformations as a consequence of oscillations of the gradient coil system 21.

Although modifications and changes maybe suggested by those skilled in the art, it is the intention of the inventors to embody within the patent warranted hereon all changes and modifications as reasonably and properly come within the scope of their contributions to the art.

We claim as our invention:

1. A magnetic resonance apparatus comprising:
    a magnetic resonance data acquisition apparatus having a non-articulated cast component subject to mechanical deformation; and
    an optical fiber having an optical fiber section with a Bragg grating therein with a Bragg wavelength associated therewith, said optical fiber section being cast together with said cast component so that said deformation of said cast component alters said Bragg wavelength to allow measurement of said deformation.

2. A magnetic resonance apparatus as claimed in claim 1 wherein optical fiber section is a first optical fiber section and wherein said Bragg grating is first Bragg grating with a first Bragg wavelength, and wherein said optical fiber further contains a second optical fiber section with a second Bragg grating having a second Bragg wavelength associated therewith, and wherein said second optical fiber section is also cast together with said cast component so that said deformation of said cast component alters at least one of said first Bragg wavelength and said second Bragg wavelength.

3. A magnetic resonance apparatus as claimed in claim 1 further comprising an operating device connected to said optical fiber for emitting light into said optical fiber.

4. A magnetic resonance apparatus as claimed in claim 3 wherein said operating device comprises a light transmitter which emits light having a prescribable spectral bandwidth.

5. A magnetic resonance apparatus as claimed in claim 4 wherein said light transmitter is selected from the group consisting of tunable laser diodes and light emitting diodes.

6. A magnetic resonance apparatus as claimed in claim 3 wherein said operating device further comprises a light receiver disposed for receiving light that is emitted into said optical fiber and that is reflected from said Bragg grating and for performing a wavelength-selective analysis of said reflected light to measure said deformation of said cast component.

7. A magnetic resonance apparatus as claimed in claim 6 wherein said light receiver, in said wavelength-selective analysis, compensates for a temperature variation of said optical fiber.

8. A magnetic resonance apparatus as claimed in claim 6 further comprising:
an actuator disposed relative to said cast component for counter-deforming said cast component; and
a control circuit connected to said actuator and to said light receiver for operating said actuator, dependent on said measure of said deformation, to counter-deform said cast component to counteract said deformation of said cast component.

9. A magnetic resonance apparatus as claimed in claim 8 further comprising an operating unit connected to said cast component for operating said cast component dependent on a variable, with operation of said cast component by said operating unit producing said deformation of said apparatus component; and
said control circuit being connected to said operating unit and being supplied with said variable from said operating unit, and said control circuit controlling said actuator dependent on said measure of said deformation said variable.

10. A magnetic resonance apparatus as claimed in claim 9 wherein said variable is selected from the group consisting of a command variable, a manipulated variable and a regulating variable.

11. A magnetic resonance apparatus as claimed in claim 8 wherein said actuator is mechanically rigidly connected to said cast component, and wherein said control circuit controls said actuator to counteract said deformation of said cast component by opposing said deformation of said apparatus component.

12. A magnetic resonance apparatus as claimed in claim 8 wherein said actuator is mechanically rigidly connected to said cast component, and wherein said control circuit controls said actuator to counteract said deformation of said cast component by opposing transmission of said deformation of said cast component.

13. A magnetic resonance apparatus as claimed in claim 8 wherein said actuator comprises a piezo-electric element.

14. A magnetic resonance apparatus as claimed in claim 8 wherein said magnetic resonance apparatus comprises a plurality of components including a gradient coil system, a superconducting basic field magnetic system having a vacuum vessel and a cryoshield, an antenna system, an outer apparatus sheath, and a connector for connecting said outer sheath to a surrounding environment, and wherein said cast component is one of said plurality of components.

15. A magnetic resonance apparatus as claimed in claim 1 wherein said apparatus component comprises a hollow-cylindrical gradient coil system.

16. A magnetic resonance apparatus as claimed in claim 15 wherein said gradient coil system has a longitudinal direction, wherein said optical fiber has an optical fiber section in which said Bragg grading is disposed and wherein said optical fiber section is oriented in said longitudinal direction.

17. A magnetic resonance apparatus as claimed in claim 15 wherein said gradient coil system has a circumferential direction, wherein said optical fiber has an optical fiber section in which said Bragg grading is disposed and wherein said optical fiber section is oriented in said circumferential direction.

18. A magnetic resonance apparatus as claimed in claim 15 wherein said gradient coil system has a radial direction, wherein said optical fiber has an optical fiber section in which said Bragg grading is disposed and wherein said optical fiber section is oriented in said radial direction.

19. A magnetic resonance apparatus as claimed in claim 15 wherein said gradient coil system has an outer cylinder surface and wherein said optical fiber has an optical fiber section in which said Bragg grating is disposed, said optical fiber section being disposed on said surface.

20. A magnetic resonance apparatus as claimed in claim 15 wherein said gradient coil system has an inner cylinder surface and wherein said optical fiber has an optical fiber section in which said Bragg grating is disposed, said optical fiber section being disposed on said surface.

21. A magnetic resonance apparatus comprising:
a magnetic resonance data acquisition apparatus having an apparatus component subject to mechanical deformation, said apparatus component having a surface; and
an optical fiber having an optical fiber section in which a Bragg grating is disposed, said Bragg grating having a Bragg wavelength associated therewith and said optical fiber section being disposed proximate to said surface of said apparatus at said surface component so that said deformation of said apparatus component alters said Bragg wavelength to allow measurement of said deformation.

22. A magnetic resonance apparatus as claimed in claim 21 wherein said optical fiber has an optical fiber section in which said Bragg grating is disposed, and wherein said optical fiber section is mechanically rigidly attached to said apparatus component.

23. A magnetic resonance apparatus as claimed in claim 21 wherein said apparatus component is a cast component, and wherein said optical fiber section is cast together with said cast component.

24. A magnetic resonance apparatus as claimed in claim 21 wherein optical fiber section is a first optical fiber section and wherein said Bragg grating is first Bragg grating with a first Bragg wavelength, and wherein said optical fiber further contains a second optical fiber section with a second Bragg grating having a second Bragg wavelength associated therewith, and wherein said second optical fiber section is also apparatus together with said apparatus component so that said deformation of said apparatus component alters at least one of said first Bragg wavelength and said second Bragg wavelength.

25. A magnetic resonance apparatus as claimed in claim 21 further comprising an operating device connected to said optical fiber for emitting light into said optical fiber.

26. A magnetic resonance apparatus as claimed in claim 25 wherein said operating device comprises a light transmitter which emits light having a prescribable spectral bandwidth.

27. A magnetic resonance apparatus as claimed in claim 26 wherein said light transmitter is selected from the group consisting of tunable laser diodes and light emitting diodes.

28. A magnetic resonance apparatus as claimed in claim 25 wherein said claim operating device further comprises a light receiver disposed for receiving light that is emitted into said optical fiber and that is reflected from said Bragg grating and for performing a wavelength-selective analysis of said reflected light to measure said deformation of said apparatus component.

29. A magnetic resonance apparatus as claimed in claim 28 wherein said light receiver, in said wavelength-selective analysis, compensates for a temperature variation of said optical fiber.

30. A magnetic resonance apparatus as claimed in claim 28 further comprising:
   an actuator disposed relative to said apparatus component for counter-deforming said apparatus component; and
   a control circuit connected to said actuator and to said light receiver for operating said actuator, dependent on said measure of said deformation, to counter-deform said apparatus component to counteract said deformation of said apparatus component.

31. A magnetic resonance apparatus as claimed in claim 30 further comprising an operating unit connected to said apparatus component for operating said apparatus component dependent on a variable, with operation of said apparatus component by said operating unit producing said deformation of said apparatus component; and
   said control circuit being connected to said operating unit and being supplied with said variable from said operating unit, and said control circuit controlling said actuator dependent on said measure of said deformation and said variable.

32. A magnetic resonance apparatus as claimed in claim 31 wherein said variable is selected from the group consisting of a command variable, a manipulated variable and a regulating variable.

33. A magnetic resonance apparatus as claimed in claim 31 wherein said actuator is mechanically rigidly connected to said apparatus component, and wherein said control circuit controls said actuator to counteract said deformation of said apparatus component by opposing said deformation of said apparatus component.

34. A magnetic resonance apparatus as claimed in claim 31 wherein said actuator is mechanically rigidly connected to said apparatus component, and wherein said control circuit controls said actuator to counteract said deformation of said apparatus component by opposing transmission of said deformation of said apparatus component.

35. A magnetic resonance apparatus as claimed in claim 31 wherein said actuator comprises a piezo-electric element.

36. A magnetic resonance apparatus as claimed in claim 31 wherein said magnetic resonance apparatus comprises a plurality of components including a gradient coil system, a superconducting basic field magnetic system having a vacuum vessel and a cryoshield, an antenna system, an outer apparatus sheath and a connector for connecting said outer sheath to a surrounding environment, and wherein said apparatus component is one of said plurality of components.

37. A magnetic resonance apparatus as claimed in claim 21 wherein said optical fiber has an optical fiber section in which said Bragg grating is disposed, and wherein at least one of said optical fiber section and said actuator is integrated into said apparatus component.

38. A magnetic resonance apparatus as claimed in claim 37 wherein said gradient coil system has a longitudinal direction, wherein said optical fiber has an optical fiber section in which said Bragg grading is disposed and wherein said optical fiber section is oriented in said longitudinal direction.

39. A magnetic resonance apparatus as claimed in claim 37 wherein said gradient coil system has a circumferential direction, wherein said optical fiber has an optical fiber section in which said Bragg grading is disposed and wherein said optical fiber section is oriented in said circumferential direction.

40. A magnetic resonance apparatus as claimed in claim 37 wherein said gradient coil system has a radial direction, wherein said optical fiber has an optical fiber section in which said Bragg grading is disposed and wherein said optical fiber section is oriented in said radial direction.

41. A magnetic resonance apparatus as claimed in claim 37 wherein said gradient coil system has an outer cylinder surface and wherein said optical fiber has an optical fiber section in which said Bragg grating is disposed, said optical fiber section being disposed on said surface.

42. A magnetic resonance apparatus as claimed in claim 37 wherein said gradient coil system has an inner cylinder surface and wherein said optical fiber has an optical fiber section in which said Bragg grating is disposed, said optical fiber section being disposed on said surface.

43. A magnetic resonance apparatus comprising;
   a magnetic resonance data acquisition apparatus having a hollow-cylindrical gradient coil system subject to mechanical deformation, said gradient coil system having a longitudinal direction, a circumferential direction and a radial direction; and
   an optical fiber having an optical fiber section in which a Bragg grating, having a Bragg wavelength associated therewith, is disposed, said optical fiber section being mounted relative to said gradient coil system so that deformation of said gradient coil system alters said Bragg wavelength, and said optical fiber section being oriented in one of said longitudinal direction, said circumferential direction and said radial direction to allow measurement of said deformation.

44. A magnetic resonance apparatus as claimed in claim 43 wherein at least one of said optical fiber section and said actuator is integrated into said apparatus component.

45. A magnetic resonance apparatus as claimed in claim 44 wherein said magnetic resonance data acquisition apparatus includes a plurality of components, including said gradient coil system, connected to each other at a plurality of connecting points, and wherein at least one of said optical fiber section and said actuator is disposed at one of said connecting points.

46. A magnetic resonance apparatus as claimed in claim 43 wherein said optical fiber has an optical fiber section in which said Bragg grating is disposed, and wherein said optical fiber section is mechanically rigidly attached to said apparatus component.

47. A magnetic resonance apparatus as claimed in claim 43 wherein optical fiber section is a first optical fiber section and wherein said Bragg grating is first Bragg grating with a first Bragg wavelength, and wherein said optical fiber further contains a second optical fiber section with a second Bragg grating having a second Bragg wavelength associated therewith, and wherein said second optical fiber section is also apparatus together with said apparatus component so that said deformation of said apparatus component alters at least one of said first Bragg wavelength and said second Bragg wavelength.

48. A magnetic resonance apparatus as claimed in claim 43 further comprising an operating device connected to said optical fiber for emitting light into said optical fiber.

49. A magnetic resonance apparatus as claimed in claim 48 wherein said operating device comprises a light transmitter which emits light having a prescribable spectral bandwidth.

50. A magnetic resonance apparatus as claimed in claim 49 wherein said light transmitter is selected from the group consisting of tunable laser diodes and light emitting diodes.

51. A magnetic resonance apparatus as claimed in claim 43 wherein said operating device further comprises a light receiver disposed for receiving light that is emitted into said optical fiber and that is reflected from said Bragg grating and for performing a wavelength-selective analysis of said reflected light to measure said deformation of said apparatus component.

52. A magnetic resonance apparatus as claimed in claim 51 wherein said light receiver, in said wavelength-selective analysis, compensates for a temperature variation of said optical fiber.

53. A magnetic resonance apparatus as claimed in claim 51 further comprising:
   an actuator disposed relative to said apparatus component for counter-deforming said apparatus component; and
   a control circuit connected to said actuator and to said light receiver for operating said actuator, dependent on said measure of said deformation, to counter-deform said apparatus component to counteract said deformation of said apparatus component.

54. A magnetic resonance apparatus as claimed in claim 53 further comprising an operating unit connected to said apparatus component for operating said apparatus component dependent on a variable, with operation of said apparatus component by said operating unit producing said deformation of said apparatus component; and
   said control circuit being connected to said operating unit and being supplied with said variable from said operating unit, and said control circuit controlling said actuator dependent on said measure of said deformation and said variable.

55. A magnetic resonance apparatus as claimed in claim 54 wherein said variable is selected from the group consisting of a command variable, a manipulated variable and a regulating variable.

56. A magnetic resonance apparatus as claimed in claim 54 wherein said actuator is mechanically rigidly connected to said apparatus component, and wherein said control circuit controls said actuator to counteract said deformation of said apparatus component by opposing said deformation of said apparatus component.

57. A magnetic resonance apparatus as claimed in claim 56 further comprising:
   an actuator disposed relative to said apparatus component for counter-deforming said apparatus component; and
   a control circuit connected to said actuator and to said light receiver for operating said actuator, dependent on said measure of said deformation, to counter-deform said apparatus component to counteract said deformation of said apparatus component.

58. A magnetic resonance apparatus as claimed in claim 57 further comprising an operating unit connected to said apparatus component for operating said apparatus component dependent on a variable, with operation of said apparatus component by said operating unit producing said deformation of said apparatus component; and
   said control circuit being connected to said operating unit and being supplied with said variable from said operating unit, and said control circuit controlling said actuator dependent on said measure of said deformation and said variable.

59. A magnetic resonance apparatus as claimed in claim 58 wherein said variable is selected from the group consisting of a command variable, a manipulated variable and a regulating variable.

60. A magnetic resonance apparatus as claimed in claim 57 wherein said actuator is mechanically rigidly connected to said apparatus component, and wherein said control circuit controls said actuator to counteract said deformation of said apparatus component by opposing said deformation of said apparatus component.

61. A magnetic resonance apparatus as claimed in claim 57 wherein said actuator comprises a piezo-electric element.

62. A magnetic resonance apparatus as claimed in claim 54 wherein said actuator is mechanically rigidly connected to said apparatus component, and wherein said control circuit controls said actuator to counteract said deformation of said apparatus component by opposing transmission of said deformation of said apparatus component.

63. A magnetic resonance apparatus as claimed in claim 54 wherein said actuator comprises a piezo-electric element.

64. A magnetic resonance apparatus as claimed in claim 54 wherein said magnetic resonance data acquisition apparatus has an exterior, and a component connecting said exterior to a surrounding environment, and wherein said optical fiber has an optical fiber section in which said Bragg grating is disposed, and wherein at least one of said optical fiber section and said actuator is disposed in said component connecting said exterior to said environment.

65. A magnetic resonance apparatus as claimed in claim 43 wherein said apparatus component is a cast component, and wherein said optical fiber section is cast together with said cast component.

66. A magnetic resonance apparatus comprising:
   a magnetic resonance data acquisition apparatus having a gradient coil system with an outer cylinder surface and an inner cylinder surface, said gradient coil system being subject to mechanical deformation; and
   an optical fiber having an optical fiber section in which a Bragg grating, having a Bragg wavelength associated therewith, is disposed, said optical fiber section being mounted relative to a surface of said gradient coil system, selected from the group consisting of said outer cylinder surface and said inner cylinder surface, so that deformation of said gradient coil system alters said Bragg wavelength to allow measurement of said deformation.

67. A magnetic resonance apparatus as claimed in claim 66 wherein said optical fiber has an optical fiber section in which said Bragg grating is disposed, and wherein said optical fiber section is mechanically rigidly attached to said apparatus component.

68. A magnetic resonance apparatus as claimed in claim 66 further comprising an operating device connected to said optical fiber for emitting light into said optical fiber.

69. A magnetic resonance apparatus as claimed in claim 68 wherein said operating device comprises a light transmitter which emits light having a prescribable spectral bandwidth.

70. A magnetic resonance apparatus as claimed in claim 69 wherein said light transmitter is selected from the group consisting of tunable laser diodes and light emitting diodes.

71. A magnetic resonance apparatus as claimed in claim 68 wherein said actuator is mechanically rigidly connected to said apparatus component, and wherein said control circuit controls said actuator to counteract said deformation of said apparatus component by opposing transmission of said deformation of said apparatus component.

72. A magnetic resonance apparatus as claimed in claim 68 wherein said operating device further comprises a light receiver disposed for receiving light that is emitted into said optical fiber and that is reflected from said Bragg grating and for performing a wavelength-selective analysis of said reflected light to measure said deformation of said apparatus component.

73. A magnetic resonance apparatus as claimed in claim 72 wherein said light receiver, in said wavelength-selective analysis, compensates for a temperature variation of said optical fiber.

74. A magnetic resonance apparatus as claimed in claim 66 wherein optical fiber section is a first optical fiber section and wherein said Bragg grating is first Bragg grating with a first Bragg wavelength, and wherein said optical fiber further contains a second optical fiber section with a second Bragg grating having a second Bragg wavelength associated therewith, and wherein said second optical fiber section is also apparatus together with said apparatus component so that said deformation of said apparatus component alters at least one of said first Bragg wavelength and said second Bragg wavelength.

* * * * *